(12) United States Patent
Wang et al.

(10) Patent No.: US 12,207,509 B2
(45) Date of Patent: Jan. 21, 2025

(54) DISPLAY SUBSTRATE, DISPLAY PANEL, AND DISPLAY DEVICE

(71) Applicants: Chengdu BOE Optoelectronics Technology Co., Ltd., Sichuan Province (CN); BOE Technology Group Co., Ltd., Beijing (CN)

(72) Inventors: Benlian Wang, Beijing (CN); Lili Du, Beijing (CN); Yue Long, Beijing (CN); Weiyun Huang, Beijing (CN)

(73) Assignees: Chengdu BOE Optoelectronics Technology Co., Ltd., Chengdu (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 17/771,842

(22) PCT Filed: Apr. 21, 2021

(86) PCT No.: PCT/CN2021/088713
§ 371 (c)(1),
(2) Date: Apr. 26, 2022

(87) PCT Pub. No.: WO2022/222066
PCT Pub. Date: Oct. 27, 2022

(65) Prior Publication Data
US 2024/0276799 A1    Aug. 15, 2024

(51) Int. Cl.
*H10K 59/131* (2023.01)
*H01L 25/16* (2023.01)
*H01L 33/62* (2010.01)

(52) U.S. Cl.
CPC ......... *H10K 59/131* (2023.02); *H01L 25/167* (2013.01); *H01L 33/62* (2013.01)

(58) Field of Classification Search
CPC .................................................. H10K 59/131
See application file for complete search history.

(56) References Cited

U.S. PATENT DOCUMENTS

| | | | |
|---|---|---|---|
| 10,743,409 B1 | 8/2020 | Hosaka | |
| 2019/0362678 A1 | 11/2019 | Shin et al. | |
| 2020/0350394 A1 | 11/2020 | Lou et al. | |
| 2021/0041969 A1* | 2/2021 | Zhao | H04N 23/57 |
| 2021/0408200 A1 | 12/2021 | Zhao et al. | |
| 2022/0059011 A1 | 2/2022 | Li et al. | |

(Continued)

FOREIGN PATENT DOCUMENTS

| | | |
|---|---|---|
| CN | 104282228 A | 1/2015 |
| CN | 108364957 A | 8/2018 |

(Continued)

*Primary Examiner* — Mounir S Amer
(74) *Attorney, Agent, or Firm* — ArentFox Schiff LLP; Michael Fainberg

(57) ABSTRACT

Disclosed are a display substrate, a display panel, and a display device. The display substrate includes a base substrate having a first display area and a second display area; a light-emitting device layer arranged on the base substrate and including a plurality of first light-emitting devices arranged in the first display area; a driving circuit layer arranged between the light-emitting device layer and the base substrate and including a plurality of first pixel circuits; and a plurality of transparent conductive layers arranged on the base substrate.

20 Claims, 13 Drawing Sheets

(56) References Cited

U.S. PATENT DOCUMENTS

2022/0123094 A1    4/2022  Qiu et al.
2022/0320146 A1   10/2022  Huang et al.
2022/0328597 A1*  10/2022  Huang ............. H10K 59/80515

FOREIGN PATENT DOCUMENTS

| CN | 109585519 A | 4/2019 |
| CN | 110491918 A | 11/2019 |
| CN | 110620129 A | 12/2019 |
| CN | 110767684 A | 2/2020 |
| CN | 111261091 A | 6/2020 |
| CN | 111326560 A | 6/2020 |
| CN | 111430427 A | 7/2020 |
| CN | 111477676 A | 7/2020 |
| CN | 111710276 A | 9/2020 |
| CN | 111739924 A | 10/2020 |
| CN | 111833747 A | 10/2020 |
| CN | 112133707 A | 12/2020 |
| JP | 0249469 A | 2/1990 |
| KR | 1020070088044 A | 8/2007 |

\* cited by examiner

| 1 | 1 | 1 | 2 | 2 | 2 | 3 | 3 | 3 |
|---|---|---|---|---|---|---|---|---|
| 1 | 1 | 1 | 2 | 2 | 2 | 3 | 3 | 3 |
| 1 | 1 | 1 | 2 | 2 | 2 | 3 | 3 | 3 |
| 1 | 1 | 1 | 2 | 2 | 2 | 3 | 3 | 3 |
| 1 | 1 | 1 | 2 | 2 | 2 | 3 | 3 | 3 |
| 1 | 1 | 1 | 2 | 2 | 2 | 3 | 3 | 3 |
| 1 | 1 | 1 | 2 | 2 | 2 | 3 | 3 | 3 |
| 1 | 1 | 1 | 2 | 2 | 2 | 3 | 3 | 3 |
| 1 | 1 | 1 | 2 | 2 | 2 | 3 | 3 | 3 |

Fig. 1

| 1 | 2 | 3 | 1 | 2 | 3 | 1 | 2 | 3 |
|---|---|---|---|---|---|---|---|---|
| 1 | 2 | 3 | 1 | 2 | 3 | 1 | 2 | 3 |
| 1 | 2 | 3 | 1 | 2 | 3 | 1 | 2 | 3 |
| 1 | 2 | 3 | 1 | 2 | 3 | 1 | 2 | 3 |
| 1 | 2 | 3 | 1 | 2 | 3 | 1 | 2 | 3 |
| 1 | 2 | 3 | 1 | 2 | 3 | 1 | 2 | 3 |
| 1 | 2 | 3 | 1 | 2 | 3 | 1 | 2 | 3 |
| 1 | 2 | 3 | 1 | 2 | 3 | 1 | 2 | 3 |
| 1 | 2 | 3 | 1 | 2 | 3 | 1 | 2 | 3 |

Fig. 2

| 1 | 1 | 1 | 1 | 1 | 1 | 1 | 1 | 1 |
|---|---|---|---|---|---|---|---|---|
| 2 | 2 | 2 | 2 | 2 | 2 | 2 | 2 | 2 |
| 3 | 3 | 3 | 3 | 3 | 3 | 3 | 3 | 3 |
| 1 | 1 | 1 | 1 | 1 | 1 | 1 | 1 | 1 |
| 2 | 2 | 2 | 2 | 2 | 2 | 2 | 2 | 2 |
| 3 | 3 | 3 | 3 | 3 | 3 | 3 | 3 | 3 |
| 1 | 1 | 1 | 1 | 1 | 1 | 1 | 1 | 1 |
| 2 | 2 | 2 | 2 | 2 | 2 | 2 | 2 | 2 |
| 3 | 3 | 3 | 3 | 3 | 3 | 3 | 3 | 3 |

Fig. 3

DISPLAY SUBSTRATE, DISPLAY PANEL, AND DISPLAY DEVICE

CROSS REFERENCE TO RELATED APPLICATIONS

The present disclosure is a US National Stage of International Application No. PCT/CN2021/088713, filed on Apr. 21, 2021, the entire contents of which are incorporated herein by reference.

FIELD

The present disclosure relates to the field of displays, and in particular to a display substrate, a display panel, and a display device.

BACKGROUND

The smartphones developed at an accelerated rate are required to combine the attractive appearance with the better visual experience of users. The manufacturers have started to increase the screen-to-body ratio of the smartphones, making the smartphones with full screens competitive. Driven by the development of the full screens, the demand for the performance and function improvement keeps being boosted. The under-screen camera can realize the visual and use experience impact to a certain extent without affecting the high screen-to-body ratio.

SUMMARY

Embodiments of the present disclosure provide a display substrate, a display panel, and a display device.

In one aspect, a display substrate provided in an embodiment of the present disclosure includes: a base substrate, including a first display area and a second display area at least arranged at one side of the first display area, where a light transmittance of the first display area is greater than a light transmittance of the second display area: a light-emitting device layer, arranged on the base substrate, where the light-emitting device layer includes a plurality of first light-emitting devices arranged in the first display area: a driving circuit layer, arranged between the light-emitting device layer and the base substrate, where the driving circuit layer includes a plurality of first pixel circuits, projections of the plurality of first pixel circuits on the base substrate do not overlap the first display area, and the plurality of first pixel circuits are electrically connected to the plurality of first light-emitting devices; and a plurality of transparent conductive layers, arranged on the base substrate, where each of the plurality of transparent conductive layers includes a plurality of transparent wires, the plurality of transparent wires are connected between the plurality of first pixel circuits and the plurality of first light-emitting devices, corresponding transparent wires electrically connected to the first light-emitting devices in a same row are arranged on at least two transparent conductive layers, and corresponding transparent wires electrically connected to first light-emitting devices in a same column are arranged on at least two transparent conductive layers.

In some embodiments, in the display substrate provided in the embodiment of the present disclosure, the plurality of first pixel circuits are arranged in the second display area, and the plurality of transparent conductive layers are arranged between the driving circuit layer and the light-emitting device layer.

In some embodiments, in the display substrate provided in the embodiment of the present disclosure, corresponding transparent wires electrically connected to any n number of adjacent first light-emitting devices are arranged at different layers in a first direction, the first direction is a row direction or a column direction, and n represents the total number of the plurality of transparent conductive layers.

In some embodiments, in the display substrate provided in the embodiment of the present disclosure, every n number of rows of first light-emitting devices are periodically arranged as one group in the first direction: the first light-emitting devices electrically connected to the transparent conductive layers are positioned complementarily among one row of the first light-emitting devices; and first light-emitting devices electrically connected to a same transparent conductive layer are positioned complementarily among one group of the first light-emitting devices.

In some embodiments, in the display substrate provided in the embodiment of the present disclosure, corresponding transparent wires electrically connected to any n number of adjacent first light-emitting devices are arranged at different layers in a second direction, the second direction is a row direction or a column direction, and the second direction intersects with the first direction.

In some embodiments, in the display substrate provided in the embodiment of the present disclosure, the plurality of transparent conductive layers include one or more first transparent conductive layer, one or more second transparent conductive layers, and one or more third transparent conductive layers which are stacked and insulated from one another, where each of the one or more first transparent conductive layers includes a plurality of first transparent wires, each of the one or more second transparent conductive layers includes a plurality of second transparent wires, and each of the one or more third transparent conductive layers includes a plurality of third transparent wires, and the first light-emitting devices electrically connected to the plurality of first transparent wires, the plurality of second transparent wires, and the plurality of third transparent wires, respectively are alternately arranged in the first direction and the second direction.

In some embodiments, in the display substrate provided in the embodiment of the present disclosure, corresponding transparent wires electrically connected to any (n−1) number of adjacent first light-emitting devices are arranged at different layers in the second direction, the second direction is a row direction or a column direction, and the second direction intersects with the first direction.

In some embodiments, in the display substrate provided in the embodiment of the present disclosure, the plurality of transparent conductive layers include one or more first transparent conductive layers, one or more second transparent conductive layers, and one or more third transparent conductive layers which are stacked and insulated from one another, where each of the one or more first transparent conductive layers includes a plurality of first transparent wires, each of the one or more second transparent conductive layers includes a plurality of second transparent wires, and each of the one or more third transparent conductive layers includes a plurality of third transparent wires, and the first light-emitting devices electrically connected to the plurality of first transparent wires, the plurality of second transparent wires, and the plurality of third transparent wires, respectively are alternately arranged in the first direction: every nine of the first light-emitting devices are circularly arranged as one repeating unit in the second direction, and in the one repeating unit, two outermost ones of the first light-emitting devices are a first first light-emitting device and a ninth first light-emitting device, respectively: every three rows of the first light-emitting devices are periodically arranged as one group of the first light-emitting devices in the first direction, and in the one group of the first light-emitting devices, two outermost rows of the first light-emitting devices are a first row of the first light-emitting devices and a third row of the first light-emitting devices, respectively: the plurality of first transparent wires are electrically connected to a first first light-emitting device, a sixth first light-emitting device, and an eighth first light-emitting device of each of repeating units in the first row of the first light-emitting devices, a third first light-emitting device, a fifth first light-emitting device, and a seventh first light-emitting device of each of repeating units in a second row of the first light-emitting devices, and a second first light-emitting device, a fourth first light-emitting device, and a ninth first light-emitting device of each of repeating units in a third row of the first light-emitting devices: the plurality of second transparent wires are electrically connected to a second first light-emitting device, a fourth first light-emitting device, and a ninth first light-emitting device of each of the repeating units in the first row of the first light-emitting devices, a first first light-emitting device, a sixth first light-emitting device, and an eighth first light-emitting device of each of the repeating units in the second row of the first light-emitting devices, and a third first light-emitting device, a fifth first light-emitting device, and a seventh first light-emitting device of each of the repeating units in the third row of the first light-emitting devices; and the plurality of third transparent wires are electrically connected to a third first light-emitting device, a fifth first light-emitting device, and a seventh first light-emitting device of each of the repeating units in the first row of the first light-emitting devices, a second first light-emitting device, a fourth first light-emitting device, and a ninth first light-emitting device of each of the repeating units in the second row of the first light-emitting devices, and a first first light-emitting device, a sixth first light-emitting device, and an eighth first light-emitting device of each of the repeating units in the third row of the first light-emitting devices.

In some embodiments, in the display substrate provided in the embodiment of the present disclosure, corresponding transparent wires electrically connected to part of (n−1) number of adjacent first light-emitting devices are arranged at different layers in a second direction, and corresponding transparent wires electrically connected to remaining (n−1) number of adjacent first light-emitting devices are arranged at a same layer in the second direction, the second direction is a row direction or a column direction, and the second direction intersects with the first direction.

In some embodiments, in the display substrate provided in the embodiment of the present disclosure, the plurality of transparent conductive layers include one or more first transparent conductive layers, one or more second transparent conductive layers, and one or more third transparent conductive layers which are stacked and insulated from one another, where each of the one or more first transparent conductive layers includes a plurality of first transparent wires, each of the one or more second transparent conductive layers includes a plurality of second transparent wires, each of the one or more third transparent conductive layers includes a plurality of third transparent wires, and the first light-emitting devices electrically connected to the plurality of first transparent wires, the plurality of second transparent wires, and the plurality of third transparent wires, respectively are alternately arranged in the first direction; every nine of the first light-emitting devices are periodically arranged as one repeating unit in the second direction, and in the one repeating unit, two outermost ones of the first light-emitting devices are a first first light-emitting device and a ninth first light-emitting device, respectively; every three rows of the first light-emitting devices are periodically arranged as one group of the first light-emitting devices in the first direction, and in the one group of the first light-emitting devices, two outermost rows of the first light-emitting devices are a first row of the first light-emitting devices and a third row of the first light-emitting devices, respectively; the plurality of first transparent wires are electrically connected to a first first light-emitting device, a fifth first light-emitting device, and a ninth first light-emitting device of each of repeating units in the first row of the first light-emitting devices, a third first light-emitting device, a fourth first light-emitting device, and an eighth first light-emitting device of each of repeating units in a second row of the first light-emitting devices, and a second first light-emitting device, a sixth first light-emitting device, and a seventh first light-emitting device of each of repeating units in a third row of the first light-emitting devices: the plurality of second transparent wires are electrically connected to a second first light-emitting device, a sixth first light-emitting device, and a seventh first light-emitting device of each of the repeating units in the first row of the first light-emitting devices, a first first light-emitting device, a fifth first light-emitting device, and a ninth first light-emitting device of each of the repeating units in the second row of the first light-emitting devices, and a third first light-emitting device, a fourth first light-emitting device, and an eighth first light-emitting device of each of the repeating units in the third row of the first light-emitting devices; and the plurality of third transparent wires are electrically connected to a third first light-emitting device, a fourth first light-emitting device, and an eighth first light-emitting device of each of the repeating units in the first row of the first light-emitting devices, a second first light-emitting device, a sixth first light-emitting device, and a seventh first light-emitting device of each of the repeating units in the second row of the first light-emitting devices, and a first first light-emitting device, a fifth first light-emitting device, and a ninth first light-emitting device of each of the repeating units in the third row of the first light-emitting devices.

In some embodiments, in the display substrate provided in the embodiment of the present disclosure, the first display area includes: a first display subarea, a second display subarea, a third display subarea, and a fourth display subarea, the first display subarea and the second display subarea are symmetrically arranged in a row direction, the third display subarea and the fourth display subarea are symmetrically arranged in the row direction, the first display subarea and the third display subarea are symmetrically arranged in a column direction, and the second display subarea and the fourth display subarea are symmetrically arranged in the column direction: the transparent wires electrically connected to the first light-emitting devices in the first display subarea extend to one side away from the second display subarea: the transparent wires electrically connected to the first light-emitting devices in the second display subarea extend to one side away from the first display subarea: the transparent wires electrically connected to the first light-emitting devices in the third display subarea extend to one side away from the fourth display subarea; and the transparent wires electrically connected to the first light-emitting devices in the fourth display subarea extend to one side away from the third display subarea.

In some embodiments, in the display substrate provided in the embodiment of the present disclosure, the numbers of the transparent wires in the transparent conductive layers are the same.

In some embodiments, in the display substrate provided in the embodiment of the present disclosure, the transparent wires in each of the transparent conductive layers do not overlap one another, and orthographic projections, on the base substrate, of the transparent wires in different transparent conductive layers do not overlap one another or at least partially overlap one another.

In some embodiments, in the display substrate provided in the embodiment of the present disclosure, the driving circuit layer includes a plurality of second pixel circuits arranged in the second display area, and the light-emitting device layer further includes a plurality of second light-emitting devices arranged in the second display area, the plurality of second light-emitting devices are electrically connected to the plurality of second pixel circuits.

In some embodiments, in the display substrate provided in the embodiment of the present disclosure, a density of the plurality of second light-emitting devices in the second display area is the same as a density of the plurality of first light-emitting devices in the first display area.

In some embodiments, in the display substrate provided in the embodiment of the present disclosure, each of the first light-emitting devices includes a first electrode, and each of the second light-emitting devices includes a second electrode, the first electrode and the second electrode are both reflective anodes or reflective cathodes; and when an emitted light color of the first light-emitting device is the same as an emitted light color of the second light-emitting device, an orthographic projection area of the first electrode on the base substrate is smaller than an orthographic projection area of the second electrode on the base substrate.

In some embodiments, in the display substrate provided in the embodiment of the present disclosure, a density of the plurality of second light-emitting devices in the second display area is greater than a density of the plurality of first light-emitting devices in the first display area.

In some embodiments, in the display substrate provided in the embodiment of the present disclosure, each of the first light-emitting devices includes a first electrode, and each of the second light-emitting devices includes a second electrode, the first electrode and the second electrode are both reflective anodes or reflective cathodes; and when an emitted light color of the first light-emitting device is the same as an emitted light color of the second light-emitting device, an orthographic projection area of the first electrode on the base substrate is equal to an orthographic projection area of the second electrode on the base substrate.

In some embodiments, in the display substrate provided in the embodiment of the present disclosure, the first display area is configured to install a light extraction module.

In another aspect, an embodiment of the present disclosure further provides a display panel, including the display substrate.

In still another aspect, an embodiment of the present disclosure further provides a display device, including a light extraction module and the display panel, the light extraction module being arranged in a first display area of the display panel.

BRIEF DESCRIPTION OF THE DRAWINGS

FIG. 1 is a routing design of transparent wires in the related art.

FIG. 2 is another routing design of transparent wires in the related art.

FIG. 3 is still another routing design of transparent wires in the related art.

DETAILED DESCRIPTION OF THE EMBODIMENTS

Figure 4:
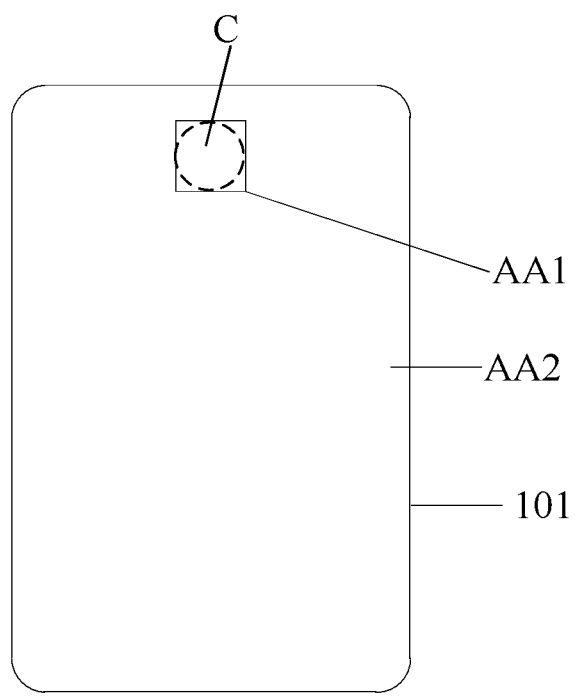
FIG. 4 is a structural schematic diagram of a display substrate provided in an embodiment of the present disclosure.

To make the objectives, technical solutions, and advantages in the embodiments of the present disclosure more clear, the technical solutions in the embodiments of the present disclosure will be clearly and completely described below in combination with the accompanying drawings in the embodiments of the present disclosure. It should be noted that sizes and shapes of diagrams in the accompanying drawings do not reflect true ratios, and are merely intended to illustrate contents of the present disclosure. In addition, the same or similar reference numerals denote the same or similar elements or elements having the same or similar function throughout. Obviously, the described embodiments are merely some of the embodiments of the present disclosure, not all of them. Based on the described embodiments of the present disclosure, all other embodiments obtained by a person of ordinary skill in the art without making inventive efforts fall within the scope of protection of the present disclosure.

Unless defined otherwise, technical or scientific terms used herein should be of ordinary meaning as understood by a person of ordinary skill in the art to which the present disclosure pertains. Expressions "first", "second", etc. used in the description and claims of the present disclosure do not denote any order, quantity, or importance, but are merely used for distinguishing between different components. Expressions "comprising", "including" or the like are intended to mean that an element or item in front of the word encompasses elements or items listed behind the word and equivalents thereof, but does not exclude other elements or items. "Inner", "outer", "upper", "lower", etc. are merely used to indicate a relative positional relation, which may also change accordingly when the absolute position of the described object changes.

According to the under-screen camera technology in the related art, only light-emitting devices are reserved in a display area where a camera is arranged, pixel circuits corresponding to the light-emitting devices are arranged outside the display area where the camera is arranged, and transparent wires are selected to electrically connect the pixel circuits outside the display area where the camera is arranged to the light-emitting devices in the display area where the camera is arranged, thereby increasing light transmittance, and ensuring a photographing effect.

Limited by a process of a transparent wire pitch, currently, three or four transparent conductive layers (such as indium tin oxide, ITO) are generally used for routing of the transparent wires. In general, transparent wires in the same layer are electrically connected to at least one row or at least one column of light-emitting devices, as shown in FIGS. 1-3, where 1, 2, and 3 in FIGS. 1-3 denote three different transparent conductive layers, and blocks in FIGS. 1-3 denote positions of the light-emitting devices.

Figure 5:
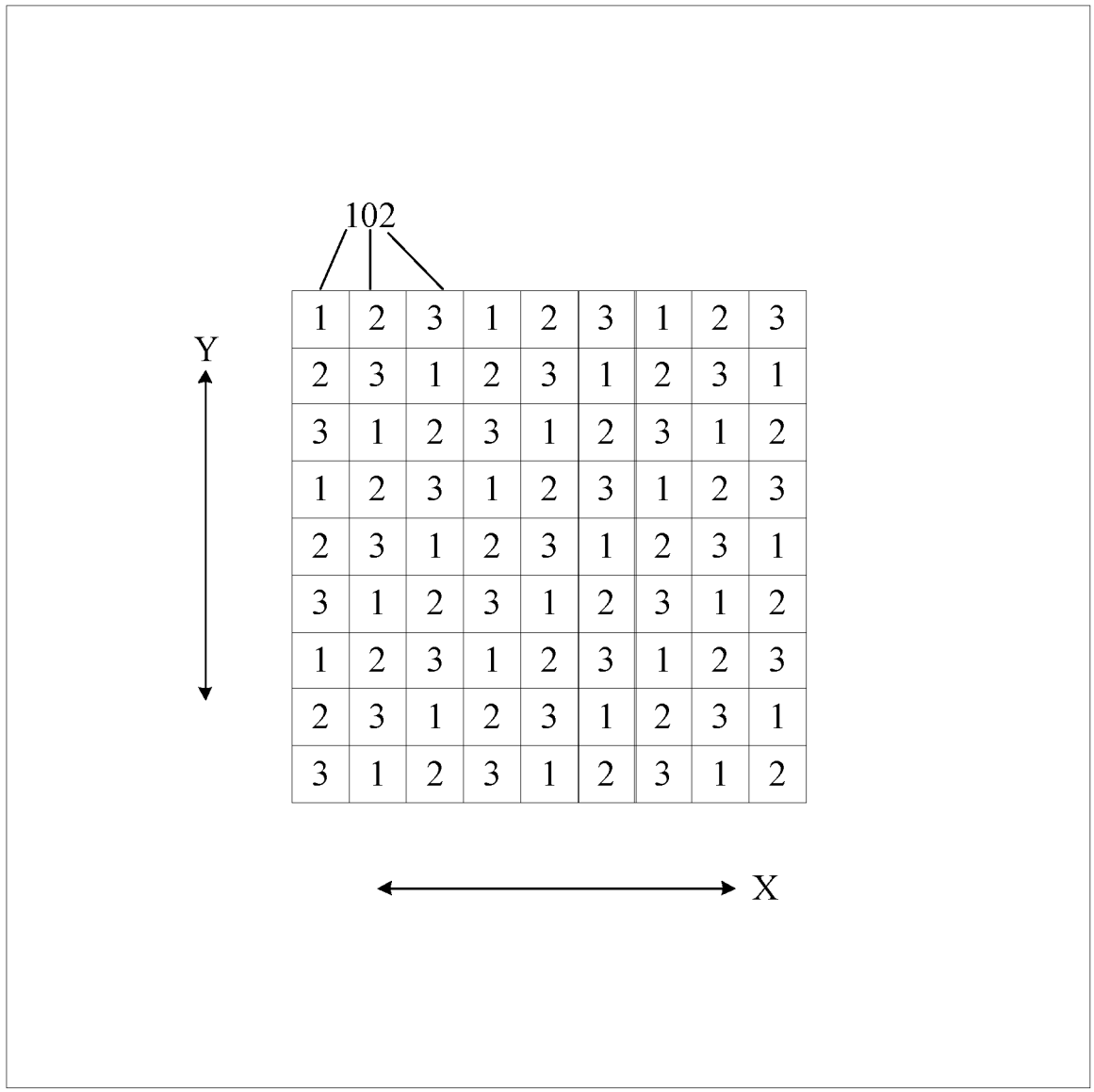
FIG. 5 is a routing design of transparent wires provided in the embodiment of the present disclosure.

However, due to differences in manufacture procedure processing between different transparent conductive layers, film thicknesses, wire widths, wire pitches, etc. of different transparent conductive layer are different, resulting in differences in loading and coupling capacitance between the transparent wires in different transparent conductive layers, and uneven display: For example, regional mura is likely to occur in FIG. 1, while vertical mura is likely to occur in FIG. 2, and horizontal mura is likely to occur in FIG. 3, thereby greatly affecting a display quality:

In order to solve at least the technical problems in the related art, an embodiment of the present disclosure provides a display substrate. As shown in FIGS. 4 and 5, the display substrate includes: a base substrate 101, including a first display area AA1 and a second display area AA2 at least arranged at one side of the first display area AA1, where a light transmittance of the first display area AA1 is greater than a light transmittance of the second display area AA2: a light-emitting device layer, arranged on the base substrate 101, where the light-emitting device layer includes a plurality of first light-emitting devices 102 arranged in the first display area AA1; a driving circuit layer, arranged between the light-emitting device layer and the base substrate 101, where the driving circuit layer includes a plurality of first pixel circuits (not shown in the figures), projections of the plurality of first pixel circuits on the base substrate 101 do not overlap the first display area AA1, and the plurality of first pixel circuits are electrically connected to the plurality of first light-emitting devices 102; and a plurality of transparent conductive layers, arranged on the base substrate 101, where each of the transparent conductive layers includes a plurality of transparent wires (not shown in the figures), the plurality of transparent wires are connected between the plurality of first pixel circuits and the plurality of first light-emitting devices 102, corresponding transparent wires electrically connected to the first light-emitting devices 102 in the same row are arranged on at least two transparent conductive layers, and corresponding transparent wires electrically connected to the first light-emitting devices 102 in the same column are arranged on at least two transparent conductive layers.

In the display substrate provided in the embodiment of the present disclosure, the transparent wires correspondingly electrically connected to the first light-emitting devices 102 in the same row are arranged on at least two transparent conductive layers, and the transparent wires correspondingly electrically connected to the first light-emitting devices 102 in the same column are arranged on at least two transparent conductive layers, so that even routing of the transparent wires in layers is provided, thereby reducing differences in loading and coupling capacitance caused by different manufacture procedure processes of the transparent conductive layers or self environments, and alleviating uneven display, etc.

In some embodiments, the plurality of first pixel circuits may be arranged in the second display area AA2, and the plurality of transparent conductive layers may be arranged between the driving circuit layer and the light-emitting device layer, to connect the first pixel circuits and the first light-emitting devices 102 through the transparent wires. In addition, the plurality of first pixel circuits are arranged in the second display area AA2, thereby increasing a screen-to-body ratio, and meeting a development trend towards a full screen.

Certainly, in some embodiments, the plurality of first pixel circuits may also be arranged in a border area, and the plurality of transparent conductive layers may be not only arranged between the driving circuit layer and the light-emitting device layer but also flexibly arranged according to requirements, which are not specifically limited herein.

In some embodiments, as shown in FIGS. 5-9, corresponding transparent wires electrically connected to any n number of adjacent first light-emitting devices 102 are arranged at different layers in a first direction Y, where the first direction Y is a row direction or a column direction, and n represents the total number of the transparent conductive layers. As can be seen from FIGS. 5-9, light-emitting devices 102 electrically connected to the transparent conductive layers are alternately arranged in the first direction Y, so that the transparent wires in the plurality of layers are evenly distributed in the first direction Y, thereby effectively solving uneven display in the row direction or the column direction that the first direction Y denotes.

In some embodiments, as shown in FIGS. 5-9, every n number of rows of the first light-emitting devices 102 are periodically arranged as one group of the first light-emitting devices 102 in the first direction Y. First light-emitting devices 102 electrically connected to the transparent conductive layers are positioned complementarily among one row of the first light-emitting devices 102. First light-emitting devices 102 electrically connected to the same transparent conductive layer are positioned complementarily among the one group of the first light-emitting devices 102. Therefore, even routing of the transparent wires 103 in the plurality of layers in the first direction Y and a second direction X, respectively may be provided, thereby effectively solving the uneven display in the row direction and the column direction.

In some embodiments, as shown in FIG. 5, corresponding transparent wires 103 electrically connected to any n number of adjacent first light-emitting devices 102 are arranged at different layers in the second direction X, where the second direction X is a row direction or a column direction, and the second direction X intersects with the first direction Y. The light-emitting devices 102 electrically connected to the transparent conductive layers are arranged alternately in the second direction X, so that the transparent wires in the plurality of layers are evenly distributed in the second direction X, thereby effectively solving the uneven display in the row direction or the column direction that the second direction X denotes.

In some embodiments, as shown in FIG. 5, the plurality of transparent conductive layers include one or more first transparent conductive layers 1, one or more second transparent conductive layers 2, and one or more third transparent conductive layers 3 which are stacked and insulated from one another. The first transparent conductive layer 1 includes a plurality of first transparent wires, the second transparent conductive layer 2 includes a plurality of second transparent wires, and the third transparent conductive layer 3 includes a plurality of third transparent wires. First light-emitting devices 102 electrically connected to the first transparent wires, the second transparent wires, and the third transparent wires, respectively, are all alternately arranged in the first direction Y and the second direction X. As can be seen from FIG. 5, the one or more first transparent conductive layers 1, the one or more second transparent conductive layers 2, and the one or more third transparent conductive layers 3 have alternate routing in the row direction and the column direction, which may effectively solve the uneven display in the row direction and the column direction.

Figure 6:
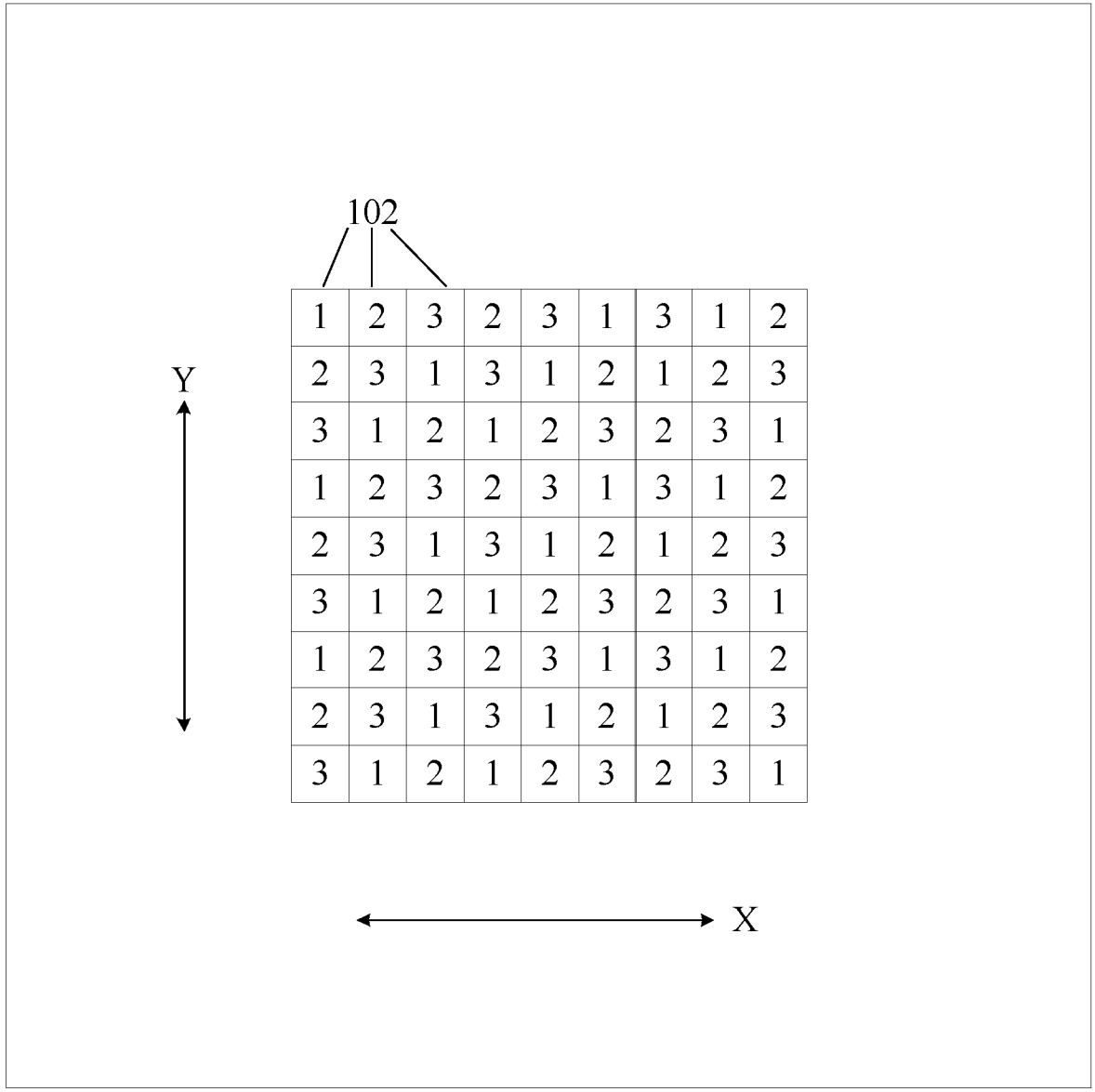
FIG. 6 is another routing design of transparent wires provided in the embodiment of the present disclosure.
Figure 8:
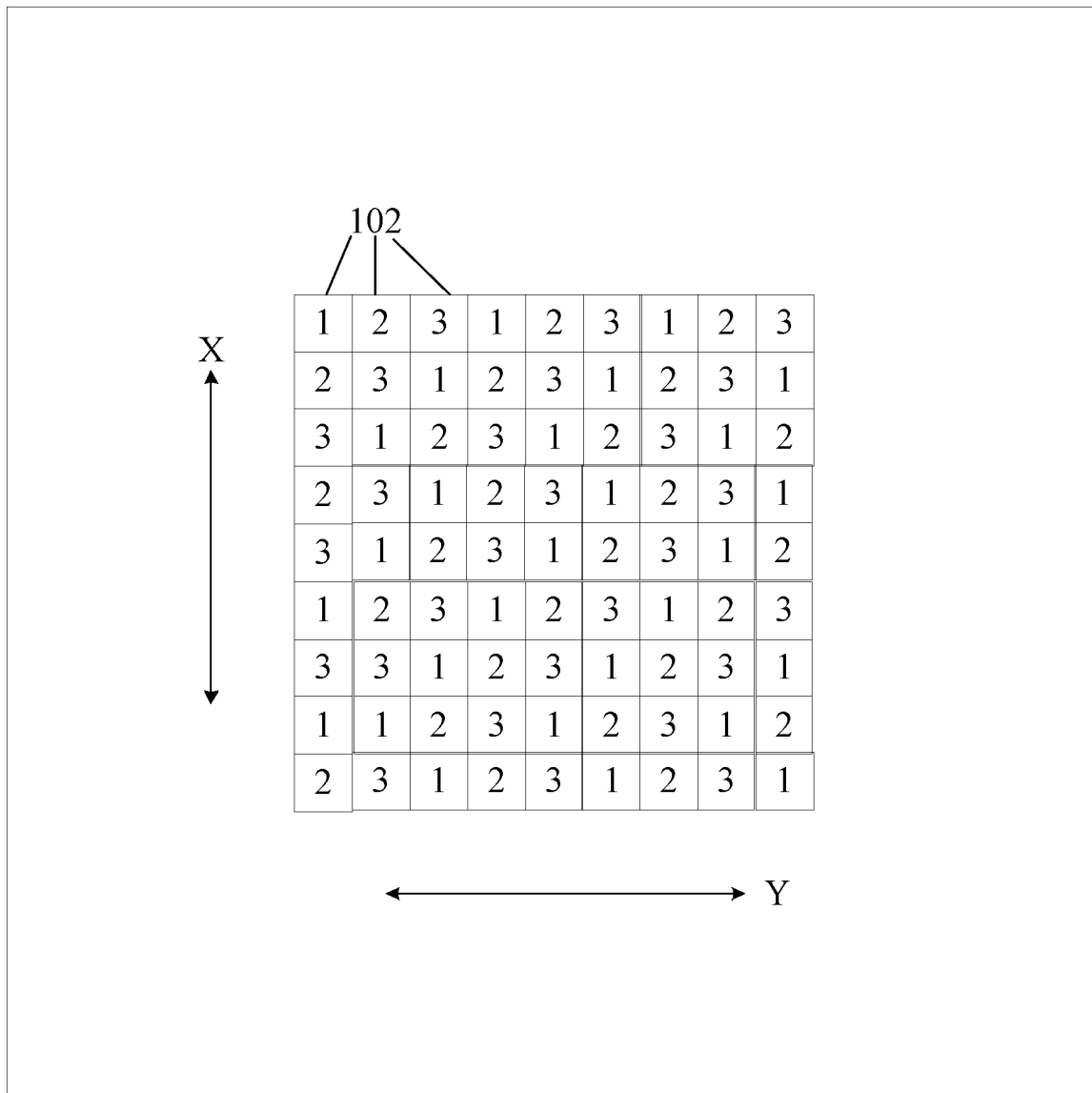
FIG. 8 is still another routing design of transparent wires provided in the embodiment of the present disclosure.

In some embodiments, as shown in FIGS. 6 and 8, corresponding transparent wires electrically connected to any (n−1) number of adjacent first light-emitting devices 102 are arranged at different layers in the second direction X. The second direction X is the row direction or the column direction, and the second direction X intersects with the first direction Y. Therefore, even routing of the transparent conductive layers in the row direction, the column direction, and a 45° diagonal direction may be provided, thereby effectively solving uneven display in the row direction, the column direction, and the 45° diagonal direction, and further improving a display quality.

In some embodiments, as shown in FIGS. 6 and 8, the plurality of transparent conductive layers include one or more first transparent conductive layers 1, one or more second transparent conductive layers 2, and one or more third transparent conductive layers 3 which are stacked and insulated from one another. The first transparent conductive layer 1 includes a plurality of first transparent wires, the second transparent conductive layer 2 includes a plurality of second transparent wires, and the third transparent conductive layer 3 includes a plurality of third transparent wires.

First light-emitting devices 102 electrically connected to the first transparent wires, the second transparent wires, and the third transparent wires, respectively are alternately arranged in the first direction Y.

Every nine of the first light-emitting devices 102 are circularly arranged as one repeating unit in the second direction X, and in the one repeating unit, two outermost ones of the first light-emitting devices are a first first light-emitting device and a ninth first light-emitting device, respectively.

Every three rows of the first light-emitting devices are periodically arranged as one group of the first light-emitting devices in the first direction Y, and in the one group of the first light-emitting devices, two outermost rows of the first light-emitting devices are a first row of the first light-emitting devices and a third row of the first light-emitting devices, respectively.

The first transparent wires are electrically connected to a first first light-emitting device, a sixth first light-emitting device, and an eighth first light-emitting device of each of repeating units in the first row of the first light-emitting devices, a third first light-emitting device, a fifth first light-emitting device, and a seventh first light-emitting device of each of repeating units in a second row of the first light-emitting devices, and a second first light-emitting device, a fourth first light-emitting device, and a ninth first light-emitting device of each of repeating units in a third row of the first light-emitting devices.

The second transparent wires are electrically connected to a second first light-emitting device, a fourth first light-emitting device, and a ninth first light-emitting device of each of the repeating units in the first row of the first light-emitting devices, a first first light-emitting device, a sixth first light-emitting device, and an eighth first light-emitting device of each of the repeating units in the second row of the first light-emitting devices, and a third first light-emitting device, a fifth first light-emitting device, and a seventh first light-emitting device of each of the repeating units in the third row of the first light-emitting devices.

The third transparent wires are electrically connected to a third first light-emitting device, a fifth first light-emitting device, and a seventh first light-emitting device of each of the repeating units in the first row of the first light-emitting devices, a second first light-emitting device, a fourth first light-emitting device, and a ninth first light-emitting device of each of the repeating units in the second row of the first light-emitting devices, and a first first light-emitting device, a sixth first light-emitting device, and an eighth first light-emitting device of each of the repeating units in the third row of the first light-emitting devices.

Figure 7:
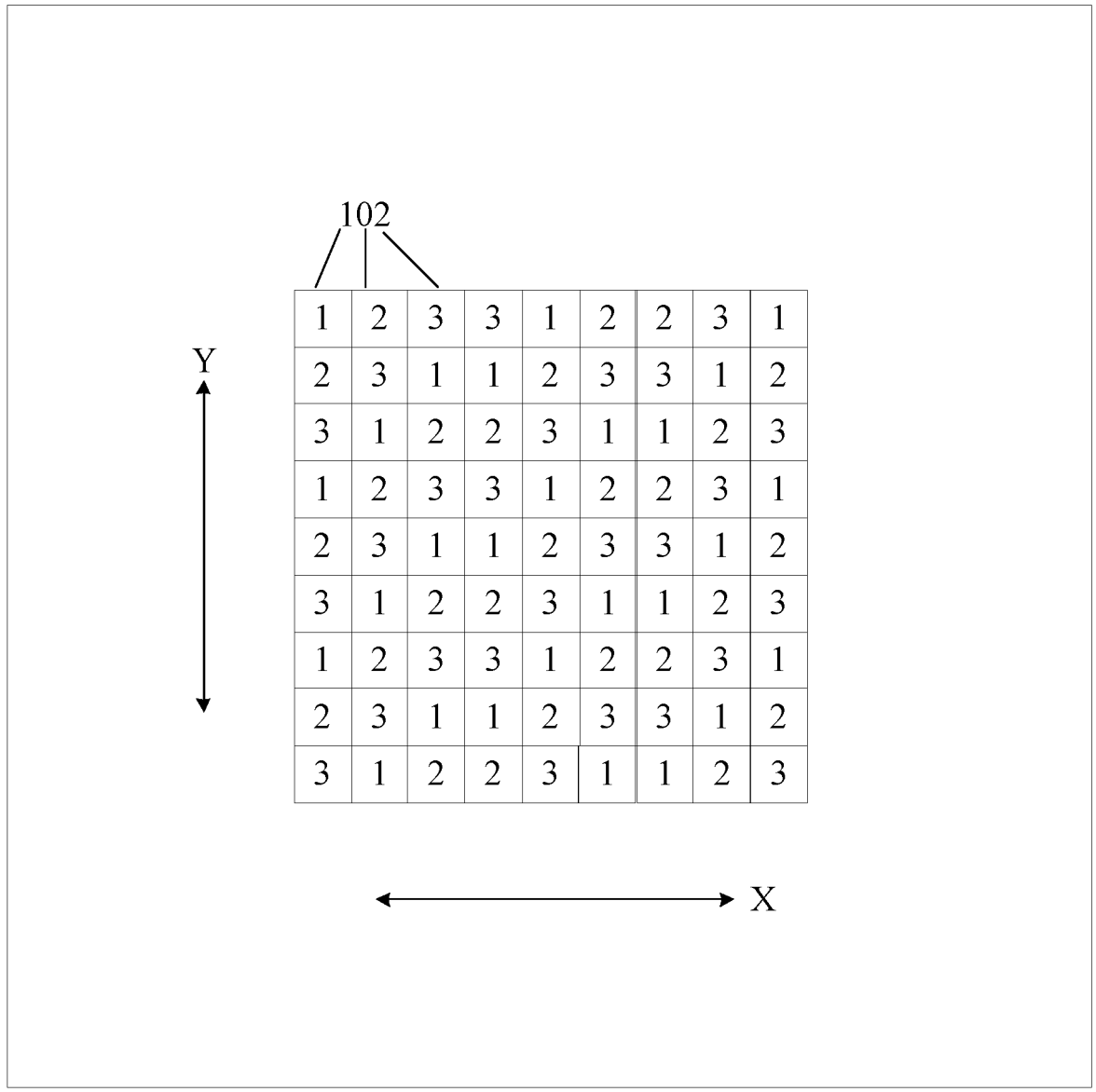
FIG. 7 is still another routing design of transparent wires provided in the embodiment of the present disclosure.
Figure 9:
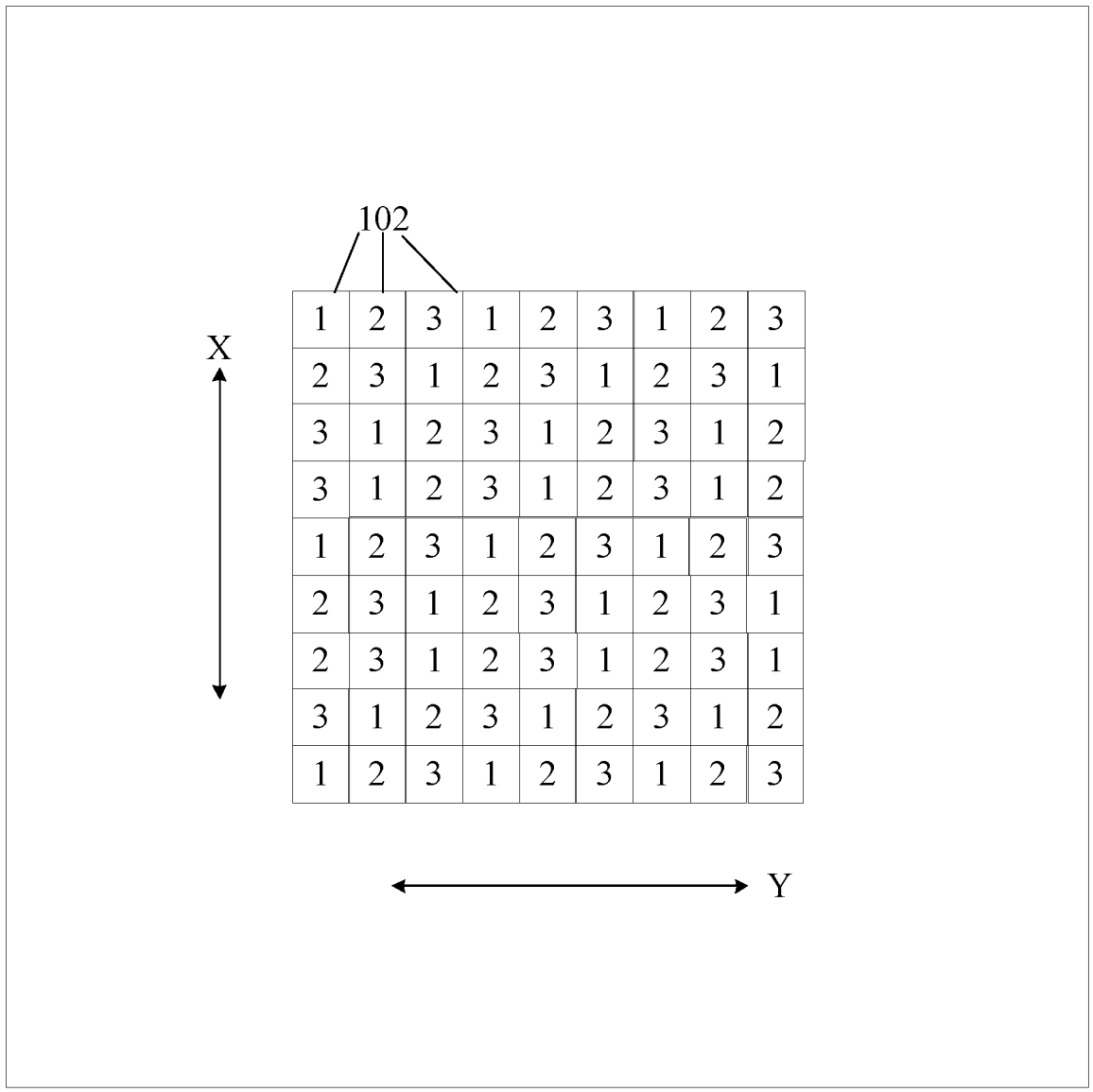
FIG. 9 is still another routing design of transparent wires provided in the embodiment of the present disclosure.
Figure 10:
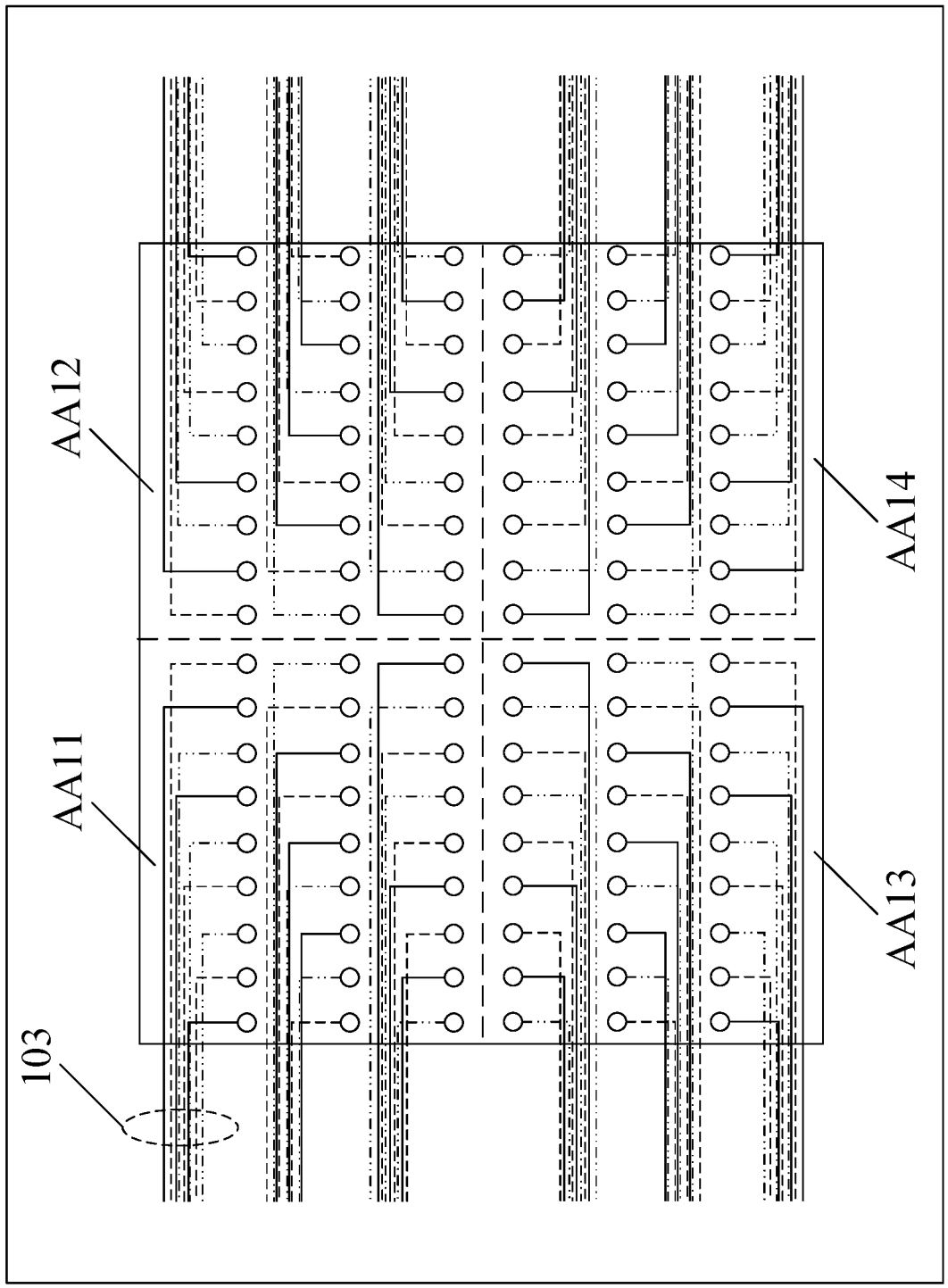
FIG. 10 is a stack diagram of transparent wires in layers provided in the embodiment of the present disclosure.

In some embodiments, as shown in FIGS. 7 and 9, in the second direction X, corresponding transparent wires electrically connected to a part of (n−1) number of adjacent first light-emitting devices are arranged at different layers, and corresponding transparent wires electrically connected to remaining (n−1) number of adjacent first light-emitting devices are arranged at the same layer. The second direction X is the row direction or the column direction, and the second direction X intersects with the first direction Y. By means of the arrangement, routing of the transparent conductive layers in the row direction, the column direction, and the 45° diagonal direction may be provided, thereby effectively solving uneven display in the row direction, the column direction, and the 45° diagonal direction, and further improving a display quality:

In some embodiments, as shown in FIGS. 7 and 9, the plurality of transparent conductive layers include one or more first transparent conductive layers 1, one or more second transparent conductive layers 2, and one or more third transparent conductive layers 3 which are stacked and insulated from one another. The first transparent conductive layer 1 includes a plurality of first transparent wires, the second transparent conductive layer 2 includes a plurality of second transparent wires, and the third transparent conductive layer 3 includes a plurality of third transparent wires.

First light-emitting devices electrically connected to the first transparent wires, the second transparent wires, and the third transparent wires, respectively are alternately arranged in the first direction Y.

Every nine of the first light-emitting devices are periodically arranged as one repeating unit in the second direction X, and in the one repeating unit, two outermost ones of the first light-emitting devices are a first first light-emitting device and a ninth first light-emitting device, respectively.

Every three rows of the first light-emitting devices are periodically arranged as one group of the first light-emitting devices in the first direction Y, and in the one group of the first light-emitting devices, two outermost rows of the first light-emitting devices are a first row of the first light-emitting devices and a third row of the first light-emitting devices, respectively.

The first transparent wires are electrically connected to a first first light-emitting device, a fifth first light-emitting device, and a ninth first light-emitting device of each of repeating units in the first row of the first light-emitting devices, a third first light-emitting device, a fourth first light-emitting device, and an eighth first light-emitting device of each of repeating units in a second row of the first light-emitting devices, and a second first light-emitting device, a sixth first light-emitting device, a seventh first light-emitting device of each of repeating units in a third row of the first light-emitting devices.

The second transparent wires are electrically connected to a second first light-emitting device, a sixth first light-emitting device, and a seventh first light-emitting device of each of the repeating units in the first row of the first light-emitting devices, a first first light-emitting device, a fifth first light-emitting device, and a ninth first light-emitting device of each of the repeating units in the second row of the first light-emitting devices, and a third first light-emitting device, a fourth first light-emitting device, and an eighth first light-emitting device of each of the repeating units in the third row of the first light-emitting devices.

The third transparent wires are electrically connected to a third first light-emitting device, a fourth first light-emitting device, and an eighth first light-emitting device of each of the repeating units in the first row of the first light-emitting devices, a second first light-emitting device, a sixth first light-emitting device, and a seventh first light-emitting device of each of the repeating units in the second row of the first light-emitting devices, and a first first light-emitting device, a fifth first light-emitting device, and a ninth first light-emitting device of each of the repeating units in the third row of the first light-emitting devices.

As can be seen from the above description, in the display substrate provided in the embodiment of the present disclosure, the uneven display may be effectively solved as long as the transparent wires in the plurality of layers are alternately electrically connected to the first light-emitting devices in the same row and in the same column. In addition, when an arrangement mode of the first light-emitting devices is fixed, the worse the regularity of an electric connection mode between the transparent wires in the plurality of layers and the first light-emitting devices is, the better the even display is.

In some embodiments, in order to reduce resistance of the transparent wires as much as possible, as shown in FIGS. 10-13, the first display area AA1 may be divided into a first display subarea AA11, a second display subarea AA12, a third display subarea AA13, and a fourth display subarea AA14. The first display subarea AA11 and the second display subarea AA12 are symmetrically arranged in the row direction, the third display subarea AA13 and the fourth display subarea AA14 are symmetrically arranged in the row direction, the first display subarea AA11 and the third display subarea AA13 are symmetrically arranged in the column direction, and the second display subarea AA12 and the fourth display subarea AA14 are symmetrically arranged in the column direction. Transparent wires 103 electrically connected to first light-emitting devices in the first display subarea AA11 extend to one side away from the second display subarea AA12, transparent wires 103 electrically connected to first light-emitting devices in the second display subarea AA12 extend to one side away from the first display subarea AA11, transparent wires 103 electrically connected to first light-emitting devices in the third display subarea AA13 extend to one side away from the fourth display subarea AA14, and transparent wires 103 electrically connected to first light-emitting devices in the fourth display subarea AA14 extend to one side away from the third display subarea AA13.

It should be noted that, during specific implementation, positional relations of the first display subarea AA11, the second display subarea AA12, the third display subarea AA13, and the fourth display subarea AA14 are not limited to symmetrical relations. For example, by means of two intersecting straight lines extending in the row direction and the column direction, respectively, the first display area AA1 may be divided into four asymmetrical areas, to be used as a first display subarea AA11, a second display subarea AA12, a third display subarea AA13, and a fourth display subarea AA14, respectively. In some embodiments, the first display subarea AA11 and the second display subarea AA12 may be arranged at two sides of the straight line extending in the column direction, the third display subarea AA13 and the fourth display subarea AA14 may be arranged at two sides of the straight line extending in the column direction, the first display subarea AA11 and the third display subarea AA13 may be arranged at two sides of the straight line extending in the row direction, and the second display subarea AA12 and the fourth display subarea AA14 may be arranged at two sides of the straight line extending in the row direction, to facilitate the routing of the transparent wires.

Figure 11:
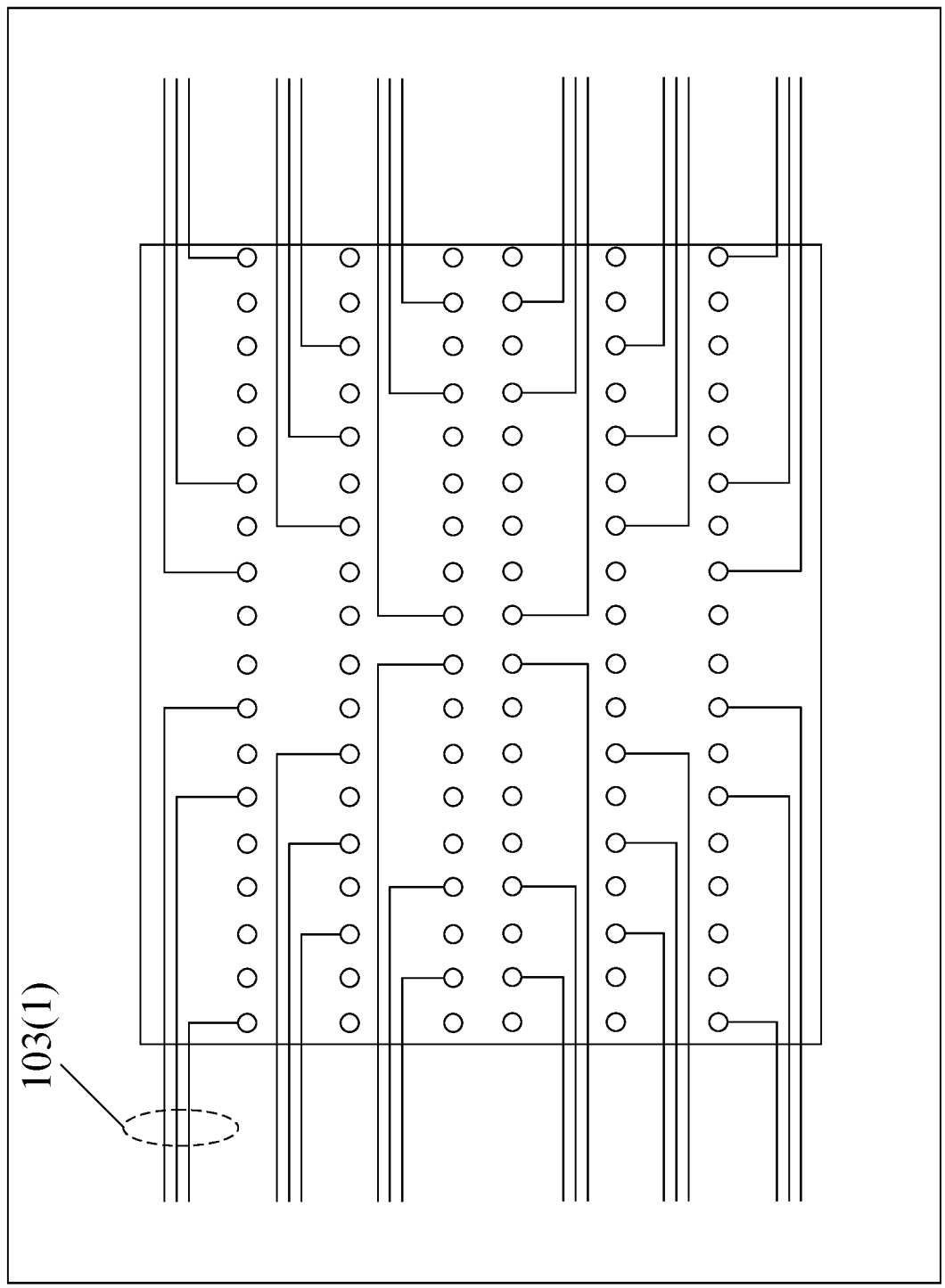
FIG. 11 is a routing design of a first transparent conductive layer provided in the embodiment of the present disclosure.
Figure 12:
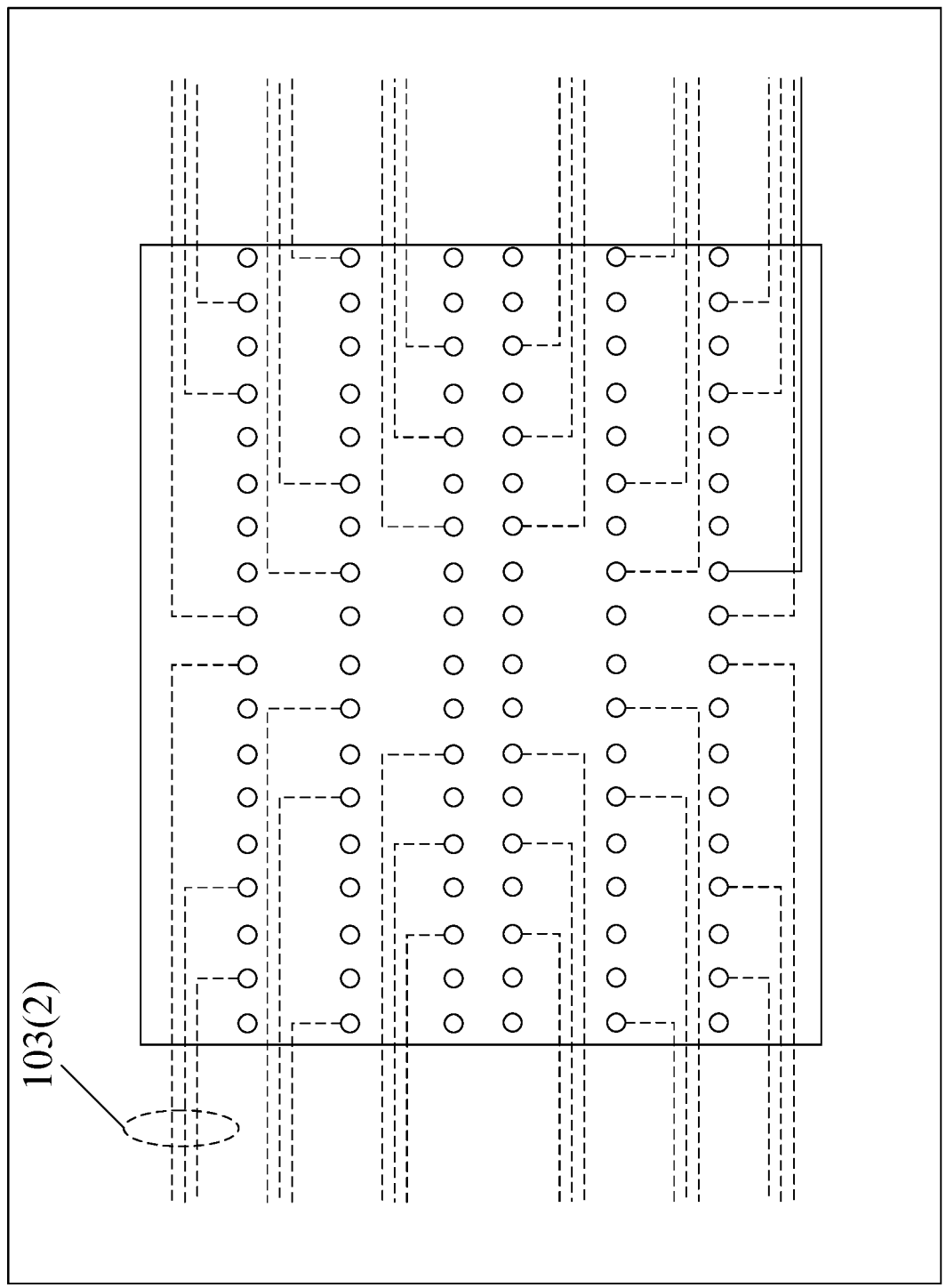
FIG. 12 is a routing design of a second transparent conductive layer provided in the embodiment of the present disclosure.
Figure 13:
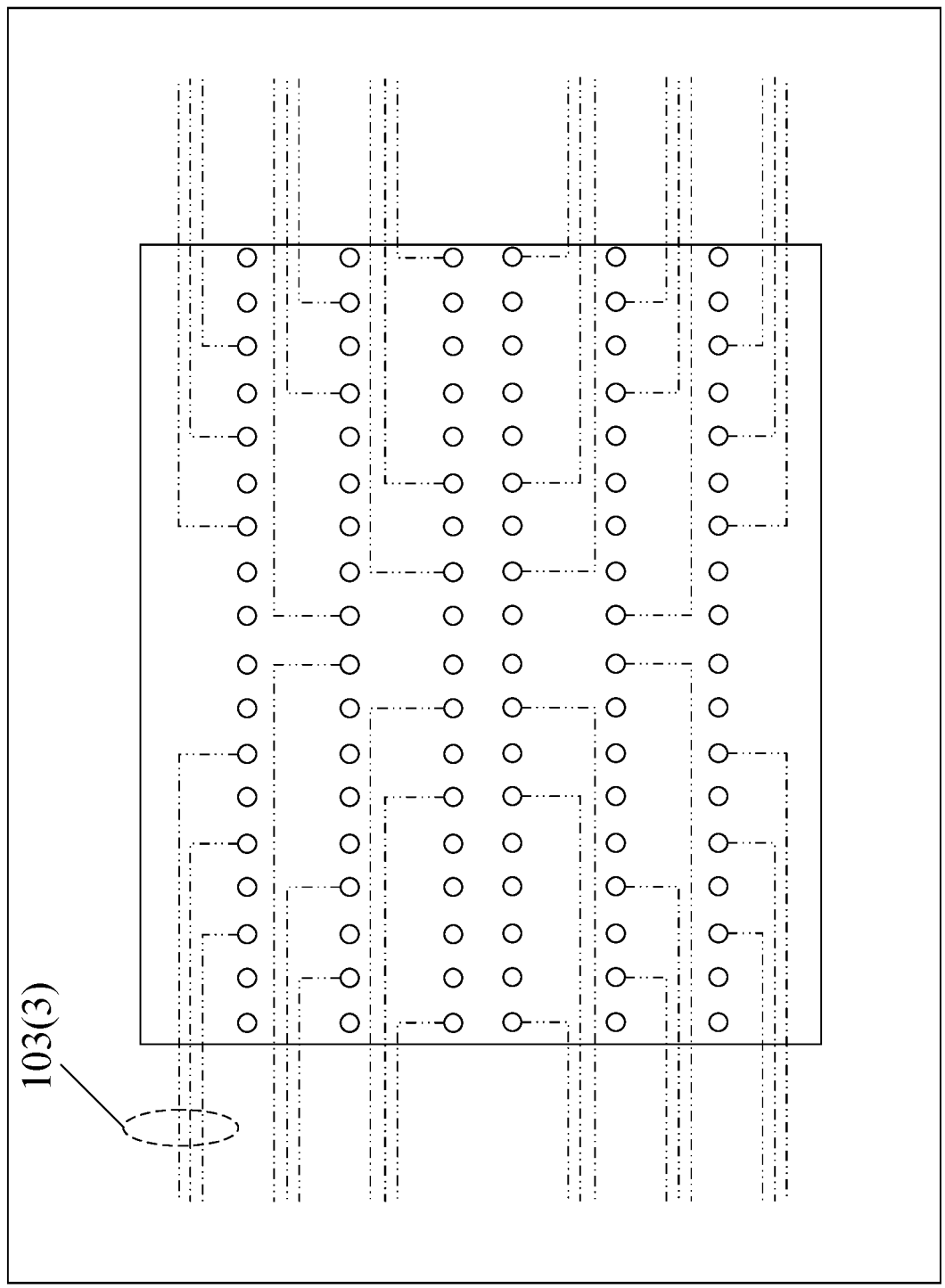
FIG. 13 is a routing design of a third transparent conductive layer provided in the embodiment of the present disclosure.

In some embodiments, as shown in FIGS. 11-13, the numbers of the transparent wires 103 in the transparent conductive layers may be the same, to facilitate an even distribution of the transparent wires 103 in the layers electrically connected to the first light-emitting devices 102.

In some embodiments, as shown in FIGS. 10-13, the transparent wires 103 in each of the transparent conductive layers do not overlap one another, and orthographic projections, on the base substrate 101, of the transparent wires 103 in different transparent conductive layers may not overlap one another, or may partially or completely overlap one another, which are not limited herein.

In some embodiments, the driving circuit layer may further include a plurality of second pixel circuits arranged in the second display area AA2, and the light-emitting device layer may further include a plurality of second light-emitting devices arranged in the second display area AA2, the plurality of second light-emitting devices are electrically connected to the plurality of second pixel circuits. In this way, the second pixel circuits may provide a driving signal for the second light-emitting devices, thereby realizing a display function of the second display area AA2.

In some embodiments, a density of the plurality of second light-emitting devices in the second display area AA2 may be the same as a density of the plurality of first light-emitting devices 102 in the first display area AA1, thereby ensuring that a resolution (PPI) of the second display area AA2 is the same as that of the first display area AA1, and improving an overall display effect.

In some embodiments, each of the first light-emitting devices 102 may include a first electrode, and each of the second light-emitting devices may include a second electrode, both the first electrode and the second electrode are reflective anodes or reflective cathodes. In order to improve a light transmittance of the first display area AA1 where the first light-emitting devices 102 are arranged, when an emitted light color of the first light-emitting device 102 is the same as an emitted light color of the second light-emitting device, an orthographic projection area of the first electrode on the base substrate may be smaller than an orthographic projection area of the second electrode on the base substrate.

In some embodiments, a density of the plurality of second light-emitting devices in the second display area AA2 may be greater than a density of the plurality of first light-emitting devices 102 in the first display area AA1, thereby improving light transmittance of the first display area AA1.

In some embodiments, each of the first light-emitting devices 102 may include a first electrode, and each of the second light-emitting devices may include a second electrode, both the first electrode and the second electrode are reflective anodes or reflective cathodes. Since a resolution of the first display area AA1 is smaller than a resolution of the second display area AA2, a light transmittance of the first display area AA1 may be improved. Therefore, a size of the first electrode does not need to be reduced. In view of the above, when an emitted light color of the first light-emitting device is the same as an emitted light color of the second light-emitting device, an orthographic projection area of the first electrode on the base substrate may be equal to an orthographic projection area of the second electrode on the base substrate.

In some embodiments, as shown in FIG. 4, the first display area AA1 is configured to install a light extraction module, which may be a camera module C, etc.

Based on the same inventive concept, an embodiment of the present disclosure further provides a display panel, including the display substrate. The display panel may be an organic light-emitting diode (OLED), a quantum dot light-emitting diode (QLED), or a micro light-emitting diode (Micro LED). Since the principle for solving the problem of the display panel is similar to that for solving the problem of the display substrate, the implementation of the display panel provided in the embodiment of the present disclosure may be referred to that of the display substrate, which is not described in detail.

Based on the same inventive concept, an embodiment of the present disclosure further provides a display device, including: a light extraction module (such as a camera module) and the display panel, the light extraction module being arranged in a first display area AA1 of the display panel. Since the principle for solving the problem of the display device is similar to that for solving the problem of the display substrate, the implementation of the display device provided in the embodiment of the present disclosure may be referred to that of the display substrate, which is not described in detail.

In some embodiments, the display device may be any product or component having a display function, such as a mobile phone, a tablet computer, a TV, a display, a notebook computer, a digital photo frame, a navigator, a smart watch, a fitness wristband, and a personal digital assistant. The display device includes, but is not limited to, a radio frequency unit, a network module, an audio output unit, an input unit, a sensor, a display unit, a user input unit, an interface unit, a memory, a processor, a power supply, etc. It should be understood by a person skilled in the art that a structure of the display device is not intended to limit the display device. The display device may include more or fewer components described above, some of the components may be combined, or different arrangements of the components may be used.

Obviously, a person skilled in the art may make various modifications and variations to the embodiments of the present disclosure without departing from the spirit and scope of the embodiments of the present disclosure. In this way, the present disclosure is also intended to include these modifications and variations to the embodiments of the present disclosure as long as they fall within the scope of the appended claims and their equivalents of the present disclosure.

What is claimed is:

1. A display substrate, comprising:
   a base substrate, comprising a first display area and a second display area at least arranged at one side of the first display area, wherein a light transmittance of the first display area is greater than a light transmittance of the second display area;
   a light-emitting device layer, arranged on the base substrate, wherein the light-emitting device layer comprises a plurality of first light-emitting devices arranged in the first display area;
   a driving circuit layer, arranged between the light-emitting device layer and the base substrate, wherein the driving circuit layer comprises a plurality of first pixel circuits, projections of the plurality of first pixel circuits on the base substrate do not overlap the first display area, and the plurality of first pixel circuits are electrically connected to the plurality of first light-emitting devices; and
   a plurality of transparent conductive layers, arranged on the base substrate, wherein each of the plurality of transparent conductive layers comprises a plurality of transparent wires, the plurality of transparent wires are connected between the plurality of first pixel circuits and the plurality of first light-emitting devices, corresponding transparent wires electrically connected to first light-emitting devices in a same row are arranged on at least two transparent conductive layers, and corresponding transparent wires electrically connected to first light-emitting devices in a same column are arranged on at least two transparent conductive layers.

2. The display substrate according to claim 1, wherein the plurality of first pixel circuits are arranged in the second display area, and the plurality of transparent conductive layers are arranged between the driving circuit layer and the light-emitting device layer.

3. The display substrate according to claim 1, wherein corresponding transparent wires electrically connected to any n number of adjacent first light-emitting devices are arranged at different layers in a first direction, the first direction is a row direction or a column direction, and n represents a total quantity of the plurality of transparent conductive layers.

4. The display substrate according to claim 3, wherein every n number of rows of first light-emitting devices are arranged periodically as one group in the first direction;
   the first light-emitting devices electrically connected to the transparent conductive layers are positioned complementarily among one row of the first light-emitting devices; and
   first light-emitting devices electrically connected to a same transparent conductive layer are positioned complementarily among one group of the first light-emitting devices.

5. The display substrate according to claim 4, wherein corresponding transparent wires electrically connected to any n number of adjacent first light-emitting devices are arranged at different layers in a second direction, the second direction is a row direction or a column direction, and the second direction intersects with the first direction.

6. The display substrate according to claim 5, wherein the plurality of transparent conductive layers comprise one or more first transparent conductive layers, one or more second transparent conductive layers, and one or more third transparent conductive layers which are stacked and insulated from one another,
   wherein each of the one or more first transparent conductive layers comprises a plurality of first transparent wires, each of the one or more second transparent conductive layers comprises a plurality of second transparent wires, and each of the one or more third transparent conductive layers comprises a plurality of third transparent wires, and the first light-emitting devices electrically connected to the plurality of first transparent wires, the plurality of second transparent wires, and the plurality of third transparent wires, respectively are alternately arranged in the first direction and the second direction.

7. The display substrate according to claim 4, wherein corresponding transparent wires electrically connected to any (n−1) number of adjacent first light-emitting devices are arranged at different layers in a second direction, the second direction is a row direction or a column direction, and the second direction intersects with the first direction.

8. The display substrate according to claim 7, wherein the plurality of transparent conductive layers comprise one or more first transparent conductive layers, one or more second transparent conductive layers, and one or more third transparent conductive layers which are stacked and insulated from one another, wherein each of the one or more first transparent conductive layers comprises a plurality of first transparent wires, each of the one or more second transparent conductive layers comprises a plurality of second transparent wires, and each of the one or more third transparent conductive layers comprises a plurality of third transparent wires, and the first light-emitting devices electrically connected to the plurality of first transparent wires, the plurality of second transparent wires, and the plurality of third transparent wires, respectively are alternately arranged in the first direction;

every nine of the first light-emitting devices are circularly arranged as one repeating unit in the second direction, and in the one repeating unit, two outermost ones of the first light-emitting devices are a first first light-emitting device and a ninth first light-emitting device, respectively;

every three rows of the first light-emitting devices are periodically arranged as one group of the first light-emitting devices in the first direction, and in the one group of the first light-emitting devices, two outermost rows of the first light-emitting devices are a first row of the first light-emitting devices and a third row of the first light-emitting devices, respectively;

the plurality of first transparent wires are electrically connected to a first first light-emitting device, a sixth first light-emitting device, and an eighth first light-emitting device of each of repeating units in the first row of the first light-emitting devices, a third first light-emitting device, a fifth first light-emitting device, and a seventh first light-emitting device of each of repeating units in a second row of the first light-emitting devices, and a second first light-emitting device, a fourth first light-emitting device, and a ninth first light-emitting device of each of repeating units in a third row of the first light-emitting devices;

the plurality of second transparent wires are electrically connected to a second first light-emitting device, a fourth first light-emitting device, and a ninth first light-emitting device of each of the repeating units in the first row of the first light-emitting devices, a first first light-emitting device, a sixth first light-emitting device, and an eighth first light-emitting device of each of the repeating units in the second row of the first light-emitting devices, and a third first light-emitting device, a fifth first light-emitting device, and a seventh first light-emitting device of each of the repeating units in the third row of the first light-emitting devices; and the plurality of third transparent wires are electrically connected to a third first light-emitting device, a fifth first light-emitting device, and a seventh first light-emitting device of each of the repeating units in the first row of the first light-emitting devices, a second first light-emitting device, a fourth first light-emitting device, and a ninth first light-emitting device of each of the repeating units in the second row of the first light-emitting devices, and a first first light-emitting device, a sixth first light-emitting device, and an eighth first light-emitting device of each of the repeating units in the third row of the first light-emitting devices.

9. The display substrate according to claim 4, wherein corresponding transparent wires electrically connected to part of (n−1) number of adjacent first light-emitting devices are arranged at different layers in a second direction, and corresponding transparent wires electrically connected to remaining (n−1) number of adjacent first light-emitting devices are arranged at a same layer in the second direction, the second direction is a row direction or a column direction, and the second direction intersects with the first direction.

10. The display substrate according to claim 9, wherein the plurality of transparent conductive layers comprise one or more first transparent conductive layers, one or more second transparent conductive layers, and one or more third transparent conductive layers which are stacked and insulated from one another, wherein each of the one or more first transparent conductive layers comprises a plurality of first transparent wires, each of the one or more second transparent conductive layers comprises a plurality of second transparent wires, each of the one or more third transparent conductive layers comprises a plurality of third transparent wires, and the first light-emitting devices electrically connected to the plurality of first transparent wires, the plurality of second transparent wires, and the plurality of third transparent wires, respectively are alternately arranged in the first direction;

every nine of the first light-emitting devices are periodically arranged as one repeating unit in the second direction, and in the one repeating unit, two outermost ones of the first light-emitting devices are a first first light-emitting device and a ninth first light-emitting device, respectively;

every three rows of the first light-emitting devices are periodically arranged as one group of the first light-emitting devices in the first direction, and in the one group of the first light-emitting devices, two outermost rows of the first light-emitting devices are a first row of the first light-emitting devices and a third row of the first light-emitting devices, respectively;

the plurality of first transparent wires are electrically connected to a first first light-emitting device, a fifth first light-emitting device, and a ninth first light-emitting device of each of repeating units in the first row of the first light-emitting devices, a third first light-emitting device, a fourth first light-emitting device, and an eighth first light-emitting device of each of repeating units in a second row of the first light-emitting devices, and a second first light-emitting device, a sixth first light-emitting device, and a seventh first light-emitting device of each of repeating units in a third row of the first light-emitting devices;

the plurality of second transparent wires are electrically connected to a second first light-emitting device, a sixth first light-emitting device, and a seventh first light-emitting device of each of the repeating units in the first row of the first light-emitting devices, a first first light-emitting device, a fifth first light-emitting device, and a ninth first light-emitting device of each of the repeating units in the second row of the first light-emitting devices, and a third first light-emitting device, a fourth first light-emitting device, and an eighth first light-emitting device of each of the repeating units in the third row of the first light-emitting devices; and the plurality of third transparent wires are electrically connected to a third first light-emitting device, a fourth first light-emitting device, and an eighth first light-emitting device of each of the repeating units in the first row of the first light-emitting devices, a second first light-emitting device, a sixth first light-emitting device, and a seventh first light-emitting device of each of the repeating units in the second row of the first light-emitting devices, and a first first light-emitting device, a fifth first light-emitting device, and a ninth first light-emitting device of each of the repeating units in the third row of the first light-emitting devices.

11. The display substrate according to claim 1, wherein the first display area comprises: a first display subarea, a second display subarea, a third display subarea, and a fourth display subarea, the first display subarea and the second display subarea are symmetrically arranged in a row direction, the third display subarea and the fourth display subarea are symmetrically arranged in the row direction, the first display subarea and the third display subarea are symmetrically arranged in a column direction, and the second display subarea and the fourth display subarea are symmetrically arranged in the column direction;

the transparent wires electrically connected to the first light-emitting devices in the first display subarea extend to one side away from the second display subarea;

the transparent wires electrically connected to the first light-emitting devices in the second display subarea extend to one side away from the first display subarea;

the transparent wires electrically connected to the first light-emitting devices in the third display subarea extend to one side away from the fourth display subarea; and the transparent wires electrically connected to the first light-emitting devices in the fourth display subarea extend to one side away from the third display subarea.

12. The display substrate according to claim 1, wherein the numbers of the transparent wires in the transparent conductive layers are the same.

13. The display substrate according to claim 1, wherein the transparent wires in each of the transparent conductive layers do not overlap one another, and orthographic projections, on the base substrate, of the transparent wires in different transparent conductive layers do not overlap one another or at least partially overlap one another.

14. The display substrate according to claim 1, wherein the driving circuit layer comprises a plurality of second pixel circuits arranged in the second display area, and the light-emitting device layer further comprises a plurality of second light-emitting devices arranged in the second display area, the plurality of second light-emitting devices are electrically connected to the plurality of second pixel circuits.

15. The display substrate according to claim 14, wherein a density of the plurality of second light-emitting devices in the second display area is the same as a density of the plurality of first light-emitting devices in the first display area.

16. The display substrate according to claim 15, wherein each of the first light-emitting devices comprises a first electrode, and each of the second light-emitting devices comprises a second electrode, the first electrode and the second electrode are both reflective anodes or reflective cathodes; and when an emitted light color of the first light-emitting device is the same as an emitted light color of the second light-emitting device, an orthographic projection area of the first electrode on the base substrate is smaller than an orthographic projection area of the second electrode on the base substrate.

17. The display substrate according to claim 14, wherein a density of the plurality of second light-emitting devices in the second display area is greater than a density of the plurality of first light-emitting devices in the first display area.

18. The display substrate according to claim 17, wherein each of the first light-emitting devices comprises a first electrode, and each of the second light-emitting devices comprises a second electrode, the first electrode and the second electrode are both reflective anodes or reflective cathodes; and when an emitted light color of the first light-emitting device is the same as an emitted light color of the second light-emitting device, an orthographic projection area of the first electrode on the base substrate is equal to an orthographic projection area of the second electrode on the base substrate;

wherein the first display area is configured to install a light extraction module.

19. A display panel, comprising a display substrate, wherein the display substrate comprises:

a base substrate, comprising a first display area and a second display area at least arranged at one side of the first display area, wherein a light transmittance of the first display area is greater than a light transmittance of the second display area;

a light-emitting device layer, arranged on the base substrate, wherein the light-emitting device layer comprises a plurality of first light-emitting devices arranged in the first display area;

a driving circuit layer, arranged between the light-emitting device layer and the base substrate, wherein the driving circuit layer comprises a plurality of first pixel circuits, projections of the plurality of first pixel circuits on the base substrate do not overlap the first display area, and the plurality of first pixel circuits are electrically connected to the plurality of first light-emitting devices; and a plurality of transparent conductive layers, arranged on the base substrate, wherein each of the plurality of transparent conductive layers comprises a plurality of transparent wires, the plurality of transparent wires are connected between the plurality of first pixel circuits and the plurality of first light-emitting devices, corresponding transparent wires electrically connected to first light-emitting devices in a same row are arranged on at least two transparent conductive layers, and corresponding transparent wires electrically connected to first light-emitting devices in a same column are arranged on at least two transparent conductive layers.

20. A display device, comprising a light extraction module and the a display panel comprising a display substrate, wherein the light extraction module is arranged in a first display area of the display panel, and the display substrate comprises:
- a base substrate, comprising the first display area and a second display area at least arranged at one side of the first display area, wherein a light transmittance of the first display area is greater than a light transmittance of the second display area;
- a light-emitting device layer, arranged on the base substrate, wherein the light-emitting device layer comprises a plurality of first light-emitting devices arranged in the first display area;
- a driving circuit layer, arranged between the light-emitting device layer and the base substrate, wherein the driving circuit layer comprises a plurality of first pixel circuits, projections of the plurality of first pixel circuits on the base substrate do not overlap the first display area, and the plurality of first pixel circuits are electrically connected to the plurality of first light-emitting devices; and
- a plurality of transparent conductive layers, arranged on the base substrate, wherein each of the plurality of transparent conductive layers comprises a plurality of transparent wires, the plurality of transparent wires are connected between the plurality of first pixel circuits and the plurality of first light-emitting devices, corresponding transparent wires electrically connected to first light-emitting devices in a same row are arranged on at least two transparent conductive layers, and corresponding transparent wires electrically connected to first light-emitting devices in a same column are arranged on at least two transparent conductive layers.

* * * * *